(12) United States Patent
Marks et al.

(10) Patent No.: US 8,110,432 B1
(45) Date of Patent: Feb. 7, 2012

(54) GATE-PLANARIZED THIN FILM TRANSISTOR SUBSTRATES AND RELATED METHODS OF FABRICATION

(75) Inventors: Tobin J. Marks, Evanston, IL (US); Antonio Facchetti, Chicago, IL (US)

(73) Assignee: Northwestern University, Evanston, IL (US)

( * ) Notice: Subject to any disclaimer, the term of this patent is extended or adjusted under 35 U.S.C. 154(b) by 471 days.

(21) Appl. No.: 11/891,720

(22) Filed: Aug. 13, 2007

Related U.S. Application Data

(60) Provisional application No. 60/837,172, filed on Aug. 11, 2006.

(51) Int. Cl.
*H01L 21/00* (2006.01)
(52) U.S. Cl. .................. 438/99; 438/48; 257/E21.259
(58) Field of Classification Search .............. 438/29, 438/99
See application file for complete search history.

(56) References Cited

U.S. PATENT DOCUMENTS

| | | | | |
|---|---|---|---|---|
| 2002/0119251 | A1* | 8/2002 | Chen et al. | 427/256 |
| 2003/0211649 | A1* | 11/2003 | Hirai et al. | 438/48 |
| 2007/0037037 | A1* | 2/2007 | Nguyen et al. | 429/38 |
| 2008/0017854 | A1 | 1/2008 | Marks et al. | |

OTHER PUBLICATIONS

Panzer, MJ; Frisbie, CD. Polymer Electrolyte Gate Dielectric Reveals Finite Windows of High Conductivity in Organic Thin Film Transistors at High Charge Carrier Densities. J. Am. Chem. Soc. 2005, 127, pp. 6960-6961.
Dodabalapur, A. Negatively Successful. Nature, vol. 434, Mar. 10, 2005, pp. 151-152.
Facchetti, A; Yoon, M-H; Marks, TJ. Gate Dielectrics for Organic Field-Effect Transistors: New Opportunities for Organic Electronics. Adv. Mater. 2005, 17, pp. 1705-1725.
Sirringhaus, H. Device Physics of Solution-Processed Organic Field-Effect Transistors. Adv. Mater. 2005, 17, pp. 2411-2425.
Ponomarenko, SA; Kirchmeyer, S; Elschner, A; Alpatova, NM; Halik, M; Kaluk, H; Zschieschang, U; Schmid, G. Decyl-End-Capped Thiophene-Phenylene Oligomers as Organic Semiconducting Materials with Improved Oxidation Stability. Chem. Mater. 2006, 18, pp. 579-586.
Yoon, M-H; Facchetti, A; Marks, TJ. σ-π molecular dielectric multilayers for low-voltage organic thin-film transistors. PNAS, Mar. 29, 2005, vol. 102, No. 13, pp. 4678-4682.
Facchetti, A; Yoon M-H; Marks, TJ. Gate-Planarized Low-Operating Voltage Organic Field-Effect Transistors Enabled by Hot Polymer Pressing/Embedding of Conduction Metal Lines. J. Am. Chem. Soc. 2006, vol. 182, No. 15, pp. 4928-4929.

* cited by examiner

*Primary Examiner* — Evan Pert
*Assistant Examiner* — Selim Ahmed
(74) *Attorney, Agent, or Firm* — Reinhart Boerner Van Deuren s.c.

(57) ABSTRACT

Thin film transistor substrates with conductor components in conjunction therewith, and related methods of fabrication.

18 Claims, 6 Drawing Sheets

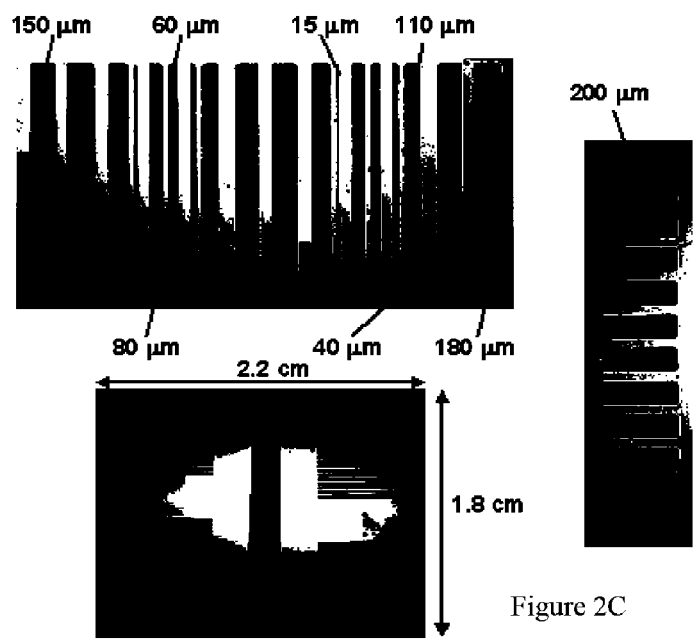
Figure 2A
Figure 2B
Figure 2C

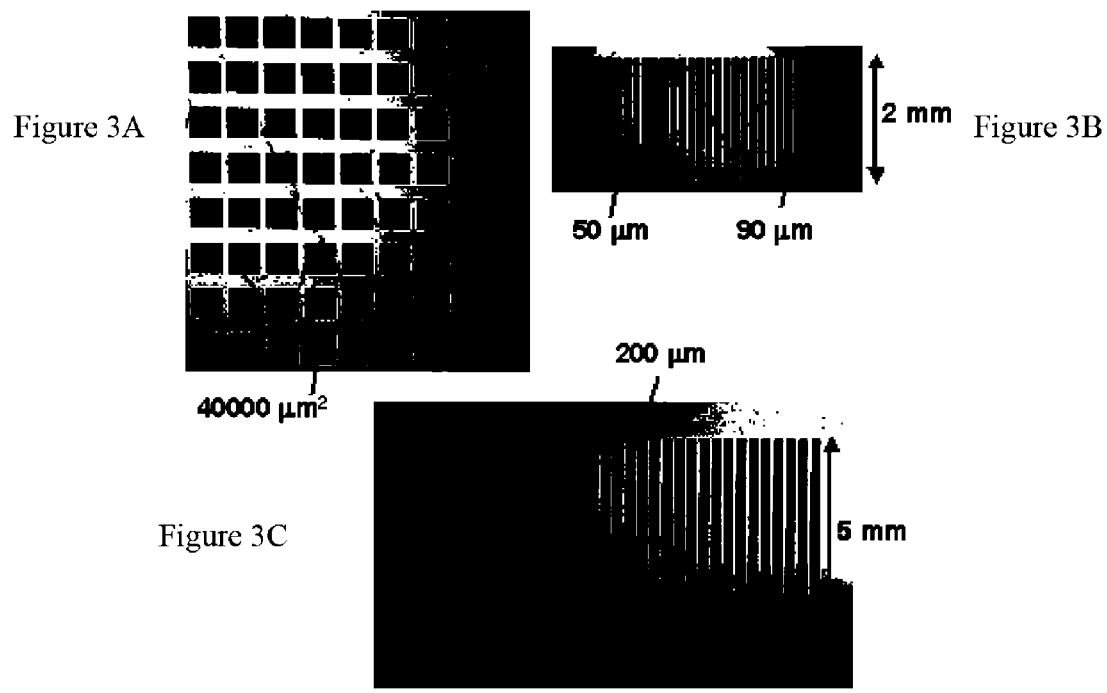
Figure 3A
Figure 3B
Figure 3C
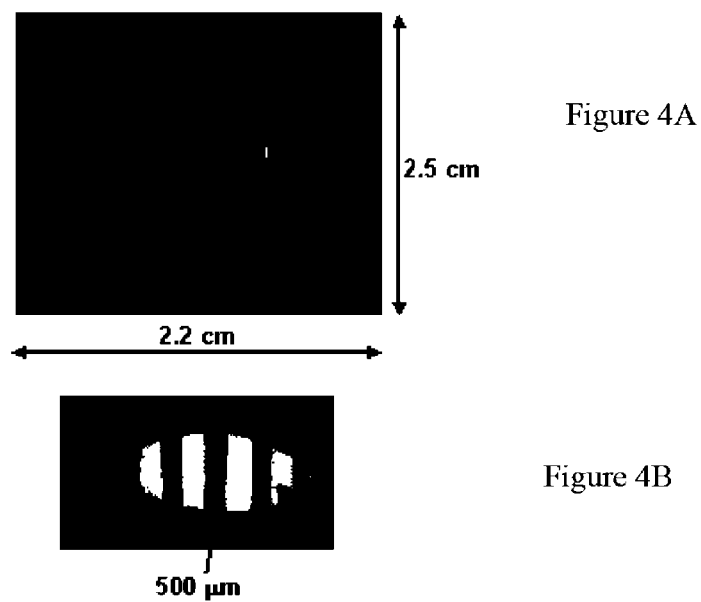
Figure 4A
Figure 4B

GATE-PLANARIZED THIN FILM TRANSISTOR SUBSTRATES AND RELATED METHODS OF FABRICATION

This application claims priority benefit from provisional application Ser. No. 60/837,172 filed on Aug. 11, 2006, the entirety of which is incorporated herein by reference.

This invention was made with government support under Grant No W911NF-05-1-0187 awarded by the Army Research Office (DARPA) and Grant No. NCC-2-3163 awarded by the National Aeronautics and Space Administration (NASA). The government has certain rights in the invention.

BACKGROUND OF THE INVENTION

"Soft" electronic products fabricated via new cost-effective processes will require the discovery/implementation of key materials components as well as unconventional routes to efficient device assembly. Organic molecular and polymeric (semi)conductors and gate dielectrics are among the most important materials for development of this new technology since they are needed for fabricating thin-film transistors (TFTs)—an essential electronic device component. Therefore, successful TFT materials candidates should be deposited via inexpensive methodologies such as spin-coating, casting, and printing and at low temperature to ensure compatibility with plastic substrates. Furthermore, for complementary circuit applications both p- (hole-) and n-type (electron-transporting) semiconductors should perform optimally with the same gate dielectric material. During the past few years, a number of efficient p- and n-type semiconductors for organic TFTs (OTFTs) have been discovered.

More recently, research in this area has attacked the problem of large OTFT operating voltages by developing new gate dielectric materials, most of which are fabricated into very thin films. However, because OTFT structures are invariably based on very thin dielectrics, the gate is unpatterned, and the issue arises as to whether it is possible to deposit nanoscopic dielectric films on patterned gate line (for practical TFT circuitry) and yet preserve excellent insulating characteristics, high dielectric strength, smooth surface morphology—to yield functional OFETs. This issue is even of greater importance for printed conductors, which are much thicker than conventional vapor-deposited metals. Accordingly, the search continues in the art for new device structures and methods of fabrication to better utilize recent material developments.

SUMMARY OF THE INVENTION

In light of the foregoing, it is an object of the present invention to provide thin film transistor substrates, devices and/or methods for their application and/or assembly, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It is an object of the present invention to provide a thin film substrate and/or device with a patterned gate configuration and one or more related methods of fabrication.

It can be another object of the present invention to provide a patterned gate conductor gate configuration, planarized with respect to a transistor substrate incorporated therewith.

It can be another object of the present invention, alone or in conjunction with one or more of the preceding objectives, to provide such a transistor substrate which can be incorporated into an organic thin film transistor, utilizing organic dielectric and/or semiconductor materials without compromising surface morphology and/or transistor function.

Other objects, features, benefits and advantages of the present invention will be apparent from this summary and the following descriptions of certain embodiments, and will be readily apparent to those skilled in the art having knowledge of various thin film transistor substrates, devices and assembly/fabrication techniques. Such objects, features, benefits and advantages will be apparent from the above as taken into conjunction with the accompanying examples, data, figures and all reasonable inferences to be drawn therefrom, alone or with consideration of the references incorporated herein.

In part, the present invention can be directed to a method of preparing a plastic polymeric substrate for a thin film transistor. Such a method can comprise providing a component comprising a conductor material thereon or coupled thereto, such a material in a predetermined line or patterned configuration; contacting the component with a plastic polymeric substrate material; and heating the plastic polymeric material for a time and/or pressure at least partially sufficient to partially transfer the patterned conductor material or lines thereof to the plastic substrate material. In certain embodiments, as can be used for effective transfer to and/or planarization of the conductor material, the plastic polymeric substrate material can be heated to a temperature about or greater than about its glass transition temperature.

A plastic polymeric substrate material utilized in conjunction with this methodology is limited only by utilization with a conductor material consistent with or as described herein. Without limitation, such a polymeric substrate material can be selected from a thermoplastic polymer, such as but not limited to a poly(methylmethacrylate), a poly(vinylpyrrolidone), a polystyrene, and a poly(dimethylsiloxane). Regardless, a conductor material can be selected from any such material known in the art to provide gate function in the context of a thin film transistor device. Without limitation, such a conductor material can comprise a metal selected from Ag, Au, Cu and Al.

Without limitation, as illustrated below, a transferred conductor material can comprise lines or a patterned configuration comprising a width dimension about or greater than 5 µm. Regardless, the corresponding thickness dimension can be less than about 400 nm, such a dimension as can be considered in the context of planarization of such a conductor material. Without limitation, as discussed elsewhere herein, such planarization can facilitate assembly or deposition of a dielectric material on or coupled to such a conductor-substrate composite. Likewise, an organic or inorganic semiconductor material can be assembled on or coupled to such a dielectric material, and as part of the fabrication of a thin film transistor device. Without limitation, a dielectric component useful in conjunction with this invention can be selected from various materials providing favorable capacitance and/or insulating properties. Without limitation, in some embodiments, such a dielectric component can include at least one of a multi-layered organic assembly, an organic polymeric composition and a metal oxide, and/or combinations thereof. Such dielectric component(s) can be selected as would be understood by those skilled in the art made aware of this invention. Without limitation, such dielectric components, including organic dielectric components, can be as described in co-pending application Ser. No. 11/642,217 filed Dec. 20, 2006 and/or the references cited therein, each of which is incorporated herein by reference in its entirety. Likewise, various semiconductor materials, as would be understood by those skilled in the art, can be used in conjunction with this invention.

In part, the present invention can also be directed to a method of using the glass transition temperature of a thermoplastic material to fabricate a gate-planarized transistor substrate. Such a method can comprise providing a component comprising a gate conductor material on or coupled thereto, such a gate conductor material in a predetermined line or pattern configuration; contacting the component and a thermoplastic polymer substrate material; and heating the thermoplastic polymer material to a temperature about or greater than about the glass transition temperature thereof for a time and/or pressure sufficient to embed the patterned gate conductor material or lines thereof into a planar surface of the thermoplastic polymer substrate material. For example and purpose of illustration, certain substrate materials—e.g., without limitation a poly(dimethylsiloxane)—can be employed in the context of such a method with little or no pressure, upon heating.

Without limitation, thermoplastic polymers useful in conjunction with such a method can include those described elsewhere herein. Likewise, a gate conductor material useful in conjunction with such a method can comprise a metal of the sort described elsewhere herein or as would be otherwise understood by those skilled in the art as providing conductor function. Regardless of polymer or conductor choice, the resulting embedded gate conductor pattern or lines can comprise a width dimension about or greater than 5 μm. Regardless, such a patterned or line configuration can have a thickness dimension less than about 400 nm. With consideration of the planarization available through use of such a methodology, the conductor-substrate-composite can be effectively incorporated into a thin film transistor device.

In part, the present invention can also be directed to a planar, flexible plastic thin film substrate. Such a substrate can comprise a patterned gate conductor therein, with the conductor-substrate interface characterized by an rms surface roughness less than about 10 nm, as can be determined under atomic force microscopy conditions of the sort described herein. Plastic and gate conductor materials can be of the sort described elsewhere herein or as would be otherwise known to those skilled in the art. Without limitation, where a gate conductor metal is either Al or Au, the rms surface roughness can be less than about 2 nm. Regardless, such a planar conductor-substrate composite can be effectively incorporated into a thin film transistor device comprising dielectric and/or semiconductor components, the latter as can comprise one or more n-type semiconducting materials or one or more p-type semiconducting materials.

Accordingly, as provided through certain embodiments, this invention can be directed to method(s) for the fabrication of patterned, gate-planarized, polymer insulator-based TFT articles, devices and related component structures, which can operate at low voltages. As illustrated by certain such embodiments, methods of the type described herein can be inexpensive and have the advantage of low fabrication temperatures and scalable manufacturing protocols. For example, as illustrated below, pressing polymeric foils or powders at temperatures above the transition glass temperatures ($T_g$) on pre-patterned conducting features allows transfer, after cooling, of a patterned conductor to the polymeric substrate film. The result can be a new flexible plastic substrate fabricated in-situ in which the film surface exposes self-planarized gate lines. For instance, and purpose of illustration only, polymer dielectric and semiconductor films can then be deposited with great uniformity, avoiding partial/irregular gate coating and functionally-catastrophic pinholes typically arising from shadow effects due to the protruding gate lines.

BRIEF DESCRIPTION OF THE DRAWINGS

FIGS. 2A-C. Transmission optical micrographs of Al features embedded into PMMA.

FIGS. 3A-C. Transmission optical micrographs of Au features embedded in PMMA.

FIGS. 4A-B. Transmission optical micrographs of printed Ag features embedded in PMMA.

DETAILED DESCRIPTION OF CERTAIN EMBODIMENTS

Figures 1A, 1B, 1C:
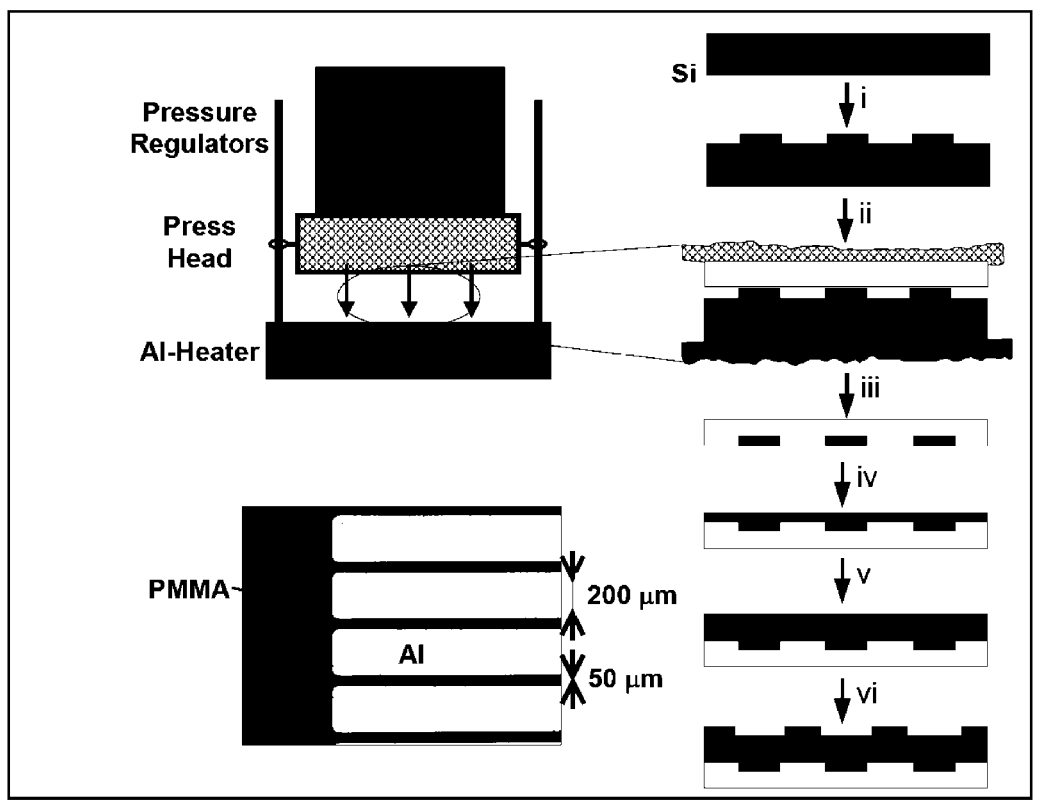
FIGS. 1A-C. A) Schematic of a representative polymer pressing/embedding setup, in accordance with one or more articles and/or methods of this invention. B) TFT fabrication process scheme, likewise, in accordance with one or more articles and/or methods of this invention: i) Conducting gate line deposition/patterning on the substrate donor; ii) Hot pressing of polymer foil/powder; iii) Peel-off of polymer embedded gate lines, yielding OFET gate-substrate; iv) Spin-coating deposition of the PVP-$C_6$ dielectric; v) Deposition of semiconducting layer; vi) Deposition of source-drain electrodes. C) Reflection optical micrograph of Al gate lines embedded in PMMA.

Various methods relating to this invention can be carried out using a hot press constructed from a bottom Al block heater and an upper weighted steel block. (FIG. 1A). TFT substrate or device fabrication begins with hot pressing/embedding the conducting gate lines (FIG. 1B). A Si (or ultrasmooth glass) donor component with vapor-deposited Al or Au lines or printed Ag particle ink features is placed on the Al heater block and poly(methylmethacrylate) (PMMA) powder (or film) is dispersed (positioned) on top.

The steel block is brought into contact and upon heating to the desired process temperature (140-180° C., >the PMMA $T_g$) a small pressure (e.g., about 300 to about 400 KPa) is applied by placing weights on the steel block. Pressure is maintained for the time required to ensure uniform conductor embedding, which can vary considerably on whether the polymer film/powder is pre-heated. After cooling below $T_g$, the new composite PMMA-conductor substrate is deattached from the Si wafer/glass donor. To facilitate detachment, the donor surface can be treated with $CF_3(CF_2)_9(CH_2)_2SiCl_3$ vapor before pattern/line deposition to yield a low surface energy self-assembled monolayer. Note that the same donor component can be used multiple times. FIGS. 1C and 2-4 show examples of the diverse metal features that can be embedded in PMMA via this process. Metal transfer/embedding yield is quantitative with Al and Au and >90% with printed Ag patterns. Features from as small as about 5 μM or less to >about 1 cm, are transferred with accuracy. For OFETs, an about 20-about 200 nm-thick CPVP-$C_6$ dielectric film layer (crosslinked polymer blend) can then be deposited by spin-coating a mixture of poly-vinylphenol (PVP) and α,ω-bis-trichlorohexane ($C_6$) crosslinking reagent in EtOH. The TFT device structure is completed by depositing the semiconductor layer (e.g., about 50 nm), and finally vapor-depositing Au source-drain electrodes (e.g., about 50 nm).

Figure 5A:
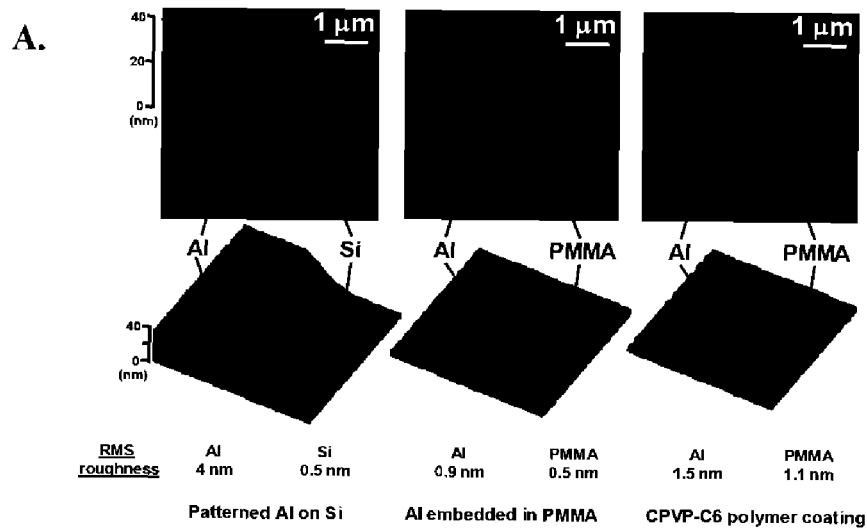
FIGS. 5A-C. AFM images of vapor-deposited Al (A), vapor-deposited Au (B), and printed Ag (C) before and after hot-pressing/embedding demonstrating gate planarization.
Figure 5B:
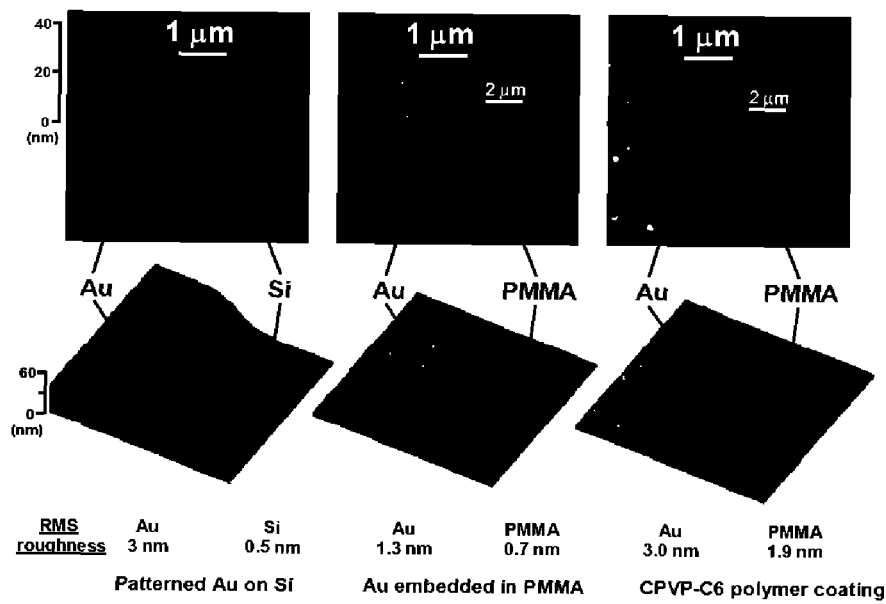
Figure 5C:
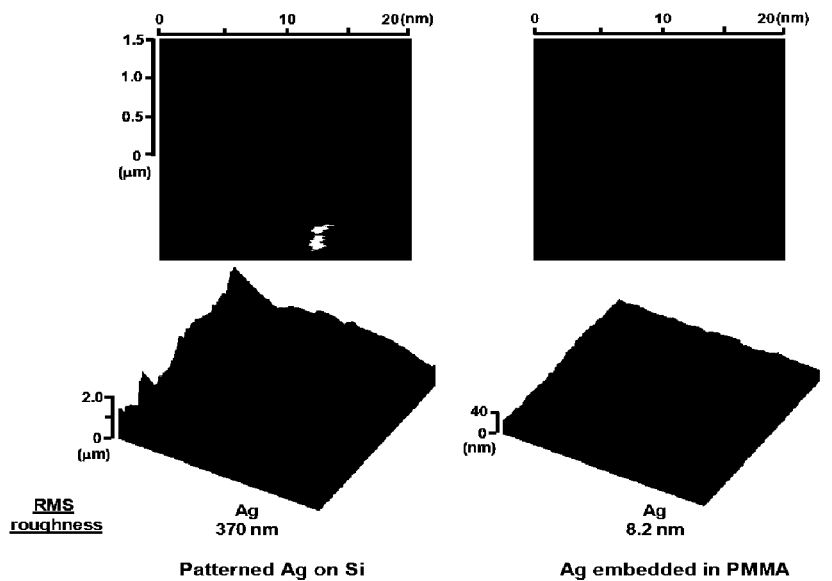
Figure 6:
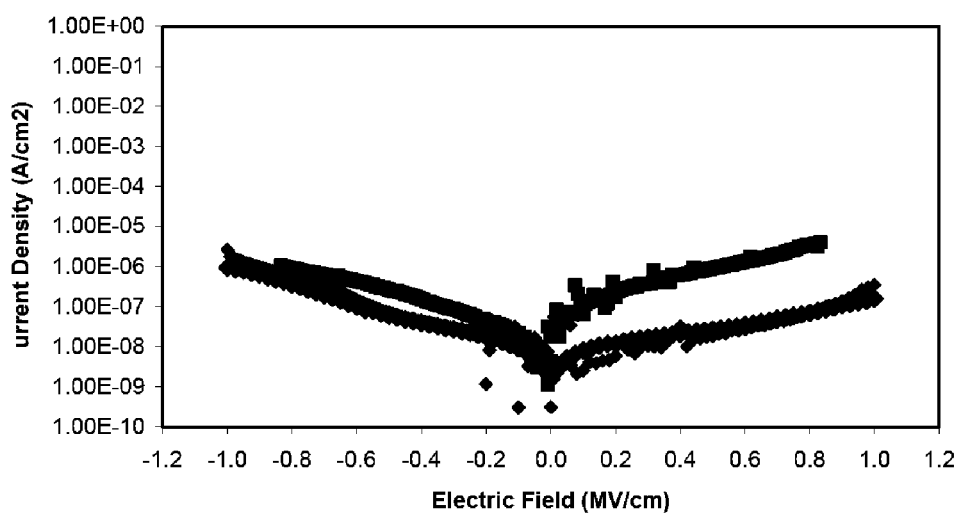
FIG. 6. Leakage current measurements for MIM structures.
Figure 7A:
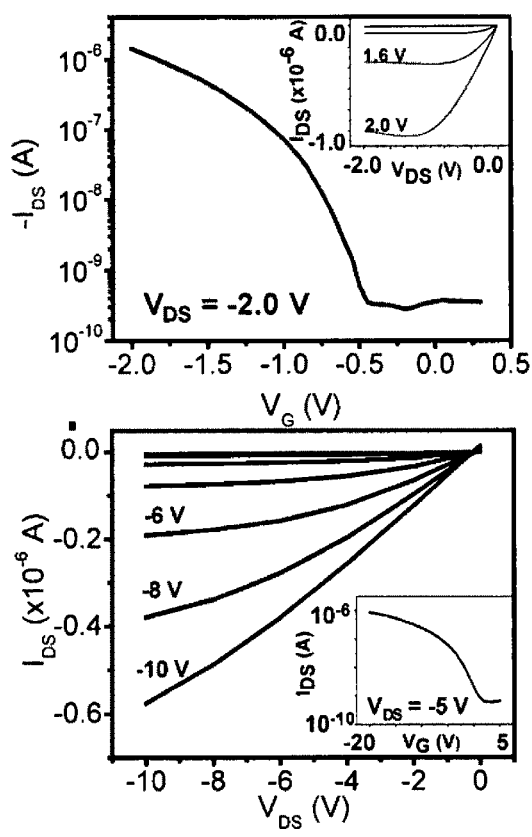
FIGS. 7A-D. Current-voltage plots and performance of the following devices: A. Al/PVP-$C_6$ ($C_i$=260 nF/cm$^2$)/pentacene/Au (L/W=100/5000 μm); ($\mu_{sat}$=0.18 cm$^2$ V$^{-1}$s$^{-1}$) B. Al/PVP-$C_6$ ($C_i$=260 nF/cm$^2$)/DFHCO-4T/Au (L/W=100/5000 μm); ($\mu_{sat}$=0.02 cm$^2$ V$^{-1}$s$^{-1}$). C. Au/PVP-$C_6$ ($C_i$=25 nF/cm$^2$)/pentacene/Au (L=100 μM, W=500 μm); ($\mu_{sat}$=0.04 cm$^2$ V$^{-1}$s$^{-1}$). D. Ag/PVP-$C_6$ ($C_i$=9 nF/cm$^2$)/pentacene/Au (L/W=100/1000 μm); ($\mu_{sat}$=0.27 cm$^2$ V$^{-1}$s$^{-1}$).
Figure 7B:
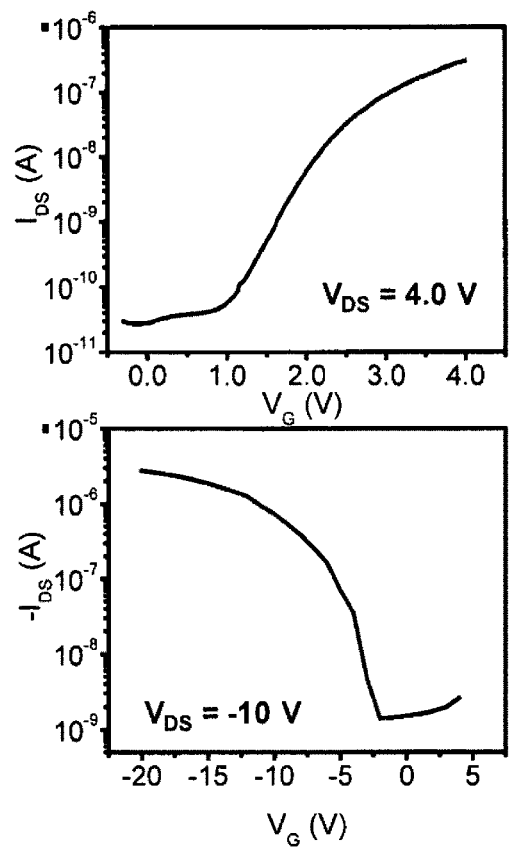
Figure 7C:
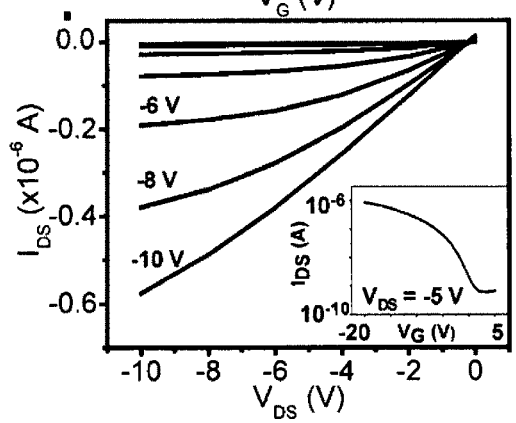
Figure 7D:
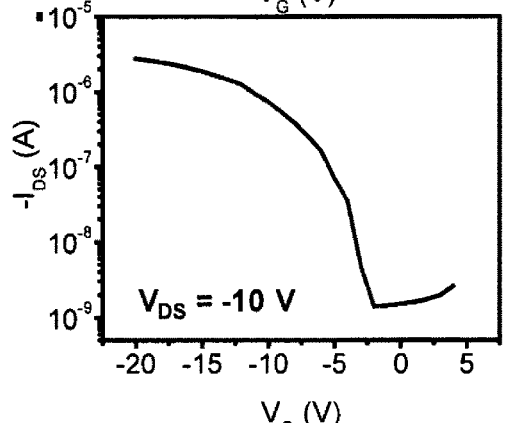

Atomic force microscopic (AFM) images of the conductor-polymer substrate interface demonstrate the efficiency of this method in transferring conductor patterns and in achieving gate planarization. FIG. 5A, left shows an AFM image of a 40 nm-thick Al line sidewall on a Si substrate. After hot-pressing, the Al-PMMA interface is planarized with an rms roughness <0.9 nm (FIG. 5A, center). On this planarized surface with embedded Al features, a 17 nm-thick dielectric film is deposited with great uniformity across the same interface (rms roughness <1.5 nm, FIG. 5A, right). Note that for all metals, the conductor-polymer substrate interface is planarized and extremely smooth (FIG. 5B, C). A range of dielectric thickness has been deposited on these different materials [d (nm) ~20 (Al); ~100 (Au); ~200 (Ag)], and the maximum dielectric capacitance [$C_i$ (nF/$cm^2$) ~280 (Al); ~40 (Au); ~12 (Ag)] depends on the bulk roughness, intrinsic wettability, and chemical characteristics of the embedded metal surface. Note that the $C_i$ of Ag-based MIM structures is lower than calculated from CPVP-$C_6$ thickness and k, as may be the result of thermoplastic resins used in the Ag ink composition which increase the effective thickness between Au top electrodes and Ag bottom particles. Leakage current-voltage measurements of (Al, Au, Ag)/insulator/Au (vapor deposited) metal-insulator-metal (MIM) structures demonstrate CPVP-$C_6$ excellent insulating properties on patterned gate-planarized lines, with all leakage current densities <$10^{-5}$ A/$cm^2$ at 1 MV/cm (FIG. 6).

OFETs fabricated as described above demonstrate the broad applicability of this process to yield low-voltage patterned gate devices. FIG. 7 shows representative output and transfer plots using different gate materials and semiconductors. Al gate-based OFETs with a ~20 nm-thick PVP-$C_6$ dielectric operate at a few volts. The results obtained in this kind of device with penatcene (p-type, FIG. 7A) and α,ω-di (1-perfluohexylcarbonyl)quaterthiophene (DFHCO-4T, n-type, FIG. 7B) demonstrate compatibility with both types of organic semiconducting materials. Pentacene OFETs with Au (FIG. 7C) and Ag (FIG. 7D) gates also function at low voltages demonstrating materials gate generality.

EXAMPLES OF THE INVENTION

The following non-limiting examples and data illustrate various aspects and features relating to the substrates/devices and/or methods of the present invention, including the fabrication of a gate-planarized substrate, as is available through the methodologies described herein. In comparison with the prior art, the present methods and substrate/devices provide results and data which are surprising, unexpected and contrary thereto. While the utility of this invention is illustrated through the use of several substrates/devices and gate conductor and plastic polymeric materials which can be used therewith, it will be understood by those skilled in the art that comparable results are obtainable with various other thin film transistors substrates/devices and gate conductor and/or polymeric materials, as are commensurate with the scope of this invention.

Materials and Reagents. For a crosslinked polymer blend, poly-4-vinylphenol (PVP; $M_w$=8K) was used without further purification and 1,6-bis(trichlorosilyl)hexane was purified by distillation under inert atmosphere. Si wafers (Montco Silicon Tech) and glass substrates (Corning Glass) were cleaned according to standard procedures. Commercially available pentacene was purified by gradient sublimation. DFHCO-4T is prepared, as reported in the literature. See, e.g., Facchetti, A.; Yoon, M. H.; Marks, T. J. Adv. Mater. 2005, 17, 1705 and references therein. PMMA was purchased from Aldrich. Conductive Ag ink (PD-055) was obtained from Acheson Colloids Inc. Al and Au were vapor-deposited using literature techniques.

Example 1

Hot-Pressing/Embedding. This process was performed in a locally fabricated hot press using a bottom Al heater and a top steel block carrying weights. Typical "donor" component size was 1-2 cm×2-4 cm. Before conductor deposition, the donor component was treated with $CF_3(CF_2)_9(CH_2)_2SiCl_3$ vapor yielding a highly hydrophobic surface (aqueous contact angle >110°) which facilitates metal/polymer detachment after hot pressing/embedding. Au and Al (40-50 nm) were deposited by thermal evaporation through a shadow mask, whereas Ag ink (>1 μm thick) was printed. The polymer powder or film was placed on top of the donor patterned with the conducting features and hot-pressed (~300-400 KPa) for 20-60 min. This time can be reduced dramatically if the polymeric foil/powder is pre-heated.

Example 2

Dielectric Film Deposition. For thin CPVP-$C_6$ fabrication (~20 nm), PVP (4 mg/mL in anhydrous EtOH) was mixed with the trichlorosilyl reagent (4 mg/mL in anhydrous EtOH) in a 1:1 volume ratio, spin-coated onto substrates at 5000 rpm, and then cured in oven at 70-80° C. for 10-15 min. For thicker CPVP-$C_6$ films (100-200 nm), PVP (40 mg/mL in anhydrous EtOH) was mixed with the trichlorosilyl reagent (30-50 mg/mL in anhydrous EtOH) in a 1:1 volume ratio, spin-coated onto substrates at 1500-3000 rpm, and then cured in oven at 70-80° C. for 15-30 min.

Example 3

Surface and Film Characterization. The morphologies of all thin films were evaluated by atomic force microscopy (AFM) using a Nanoscope III microscope with A and D scanners (Digital Instruments, Inc.). All images were recorded under ambient conditions in the contact mode with $Si_3N_4$ cantilevers having pyramidal tips with 70° cone angles and about 20-about 50 nm radii of curvature. No attempt was made to account for tip convolution. The cantilever had a force constant of about 0.12 N/m. The images were obtained using the height mode with a total force of about 20-about 60 nN and a scan rate of about 10 Hz. The same image was scanned at least three times to ensure the reproducibility as well as by scanning different area sizes (i.e., higher or lower magnifications) to verify image consistency. All the RMS surface-roughness values can be reported over an area of 25 μm². Thicknesses of all organic thin films were measured using a Tencor P-10 surface profiler.

Electrical Measurements. OTFTs were fabricated and evaluated as described previously. See, Facchetti and Marks, supra. Gold electrodes for OTFT/MIS/MIM devices were vacuum-deposited through shadow masks at $3\text{-}4\times10^{-6}$ Torr (1000 Å, 0.5 Å/s). OTFT measurements were carried out in air using a Keithly 6430 subfemtoammeter and a Keithly 2400 source meter, operated by a local Labview program and GPIB communication. Triaxial and/or coaxial shielding was incorporated into Signaton probe stations to minimize the noise level. The same instrumentation was used for a digital capacitance meter (Model 3000, GLK Instruments) and impedance/gain-phase analyzer (SI 1260, Solartron Analytical) were used for capacitance measurements.

As shown above, a new methodology for fabricating patterned, gate-planarized OFETs based on hot polymer pressing/embedding has been demonstrated. This methodology is applicable to a variety of gate conductors and polymer matrices, and the resulting devices function at low voltages with a variety of semiconductors, providing new routes to inexpensive printed electronics.

We claim:

1. A method of preparing a plastic polymeric substrate for a thin film transistor, said method comprising:
   providing a component comprising a conductor material coupled thereto, said conductor material in a predetermined pattern;
   contacting said component with a poly(methylmethacrylate) substrate material; and
   heating said poly(methylmethacrylate) substrate material to a temperature greater than about the glass transition temperature of poly(methylmethacrylate) and for a time and/or at a pressure sufficient to at least partially transfer said patterned conductor material into said poly(methylmethacrylate) substrate material.

2. The method of claim 1 wherein said conductor material comprises a metal selected from Ag, Au, Cu, and Al.

3. The method of claim 1 wherein a dielectric material is coupled to said poly(methylmethacrylate) substrate material.

4. The method of claim 3 wherein an organic semiconductor material is coupled to said dielectric material.

5. The method of claim 1 wherein said transferred pattern comprises a width dimension greater than about 5 µm and a thickness dimension less than about 400 nm.

6. A method of fabricating a gate-planarized transistor, said method comprising:
   providing a donor component comprising a patterned gate conductor material coupled thereto;
   contacting said patterned gate conductor material with a poly(methylmethacrylate) substrate; and
   heating said poly(methylmethacrylate) substrate to a temperature greater than about the glass transition temperature of poly(methylmethacrylate) and for a time and/or at a pressure sufficient to embed said patterned gate conductor material into a plane of said poly(methylmethacrylate) substrate;
   depositing a planar dielectric layer on the plane of said poly(methylmethacrylate) substrate into which said patterned gate conductor material is embedded;
   depositing a semiconducting layer in contact with the planar dielectric layer; and
   depositing source-drain electrodes in contact with the semiconducting layer.

7. The method of claim 6 wherein said pattern of said embedded gate conductor material comprises a width dimension greater than about 5 µm and a thickness dimension less than about 400 nm.

8. The method of claim 6 wherein said conductor-substrate is incorporated into a thin film transistor device.

9. A method of preparing a planar polymeric substrate comprising a patterned conductor material embedded therein for a thin film transistor, said method comprising:
   providing a donor component comprising a patterned conductor material coupled thereto;
   contacting said patterned conductor material with a planar polymeric substrate;
   heating said planar polymeric substrate for a time and/or at a pressure sufficient to embed said patterned conductor material into a plane of said planar polymeric substrate, wherein the plane of said planar polymeric substrate remains substantially planar after said patterned conductor material has been embedded therein; and
   detaching the patterned conductor material embedded in the planar polymeric substrate from the donor component.

10. The method of claim 9 wherein said planar polymeric substrate is heated to a temperature selected from about and greater than about the glass transition temperature thereof.

11. The method of claim 9 wherein said planar polymeric substrate is of a material selected from thermoplastic polymers.

12. The method of claim 11 wherein said material is selected from a poly(methylmethacrylate), a poly(vinylpyrrolidone), a polystyrene, and a poly(dimethylsiloxane).

13. The method of claim 12, wherein said material is poly(methylmethacrylate) and is heated to a temperature greater than about the glass transition temperature thereof.

14. The method of claim 9 wherein said patterned conductor material comprises a metal selected from Ag, Au, Cu, and Al.

15. The method of claim 9 wherein a dielectric material is coupled to said planar polymeric substrate.

16. The method of claim 15 wherein an organic semiconductor material is coupled to said dielectric material.

17. The method of claim 9 wherein said embedded pattern comprises a width greater than about 5 µm and a thickness dimension less than about 400 nm.

18. The method of claim 9 comprising treating the donor component to provide a hydrophobic surface thereon, and coupling the patterned conductor material to said hydrophobic surface.

* * * * *

UNITED STATES PATENT AND TRADEMARK OFFICE
CERTIFICATE OF CORRECTION

PATENT NO. : 8,110,432 B1  
APPLICATION NO. : 11/891720  
DATED : February 7, 2012  
INVENTOR(S) : Tobin J. Marks and Antonio Facchetti It is certified that error appears in the above-identified patent and that said Letters Patent is hereby corrected as shown below:

Column 1, Lines 8-13:

"This invention was made with government support under Grant No. W911NF-05-1-0187 awarded by the Army Research Office (DARPA) and Grant No. NCC-2-3163 awarded by the National Aeronautics and Space Administration (NASA). The government has certain rights in the invention." should be -- This invention was made with government support under grant number W911NF-05-1-0187 awarded by the Army Research Office (DARPA) and grant number NCC-2-1363 awarded by the National Aeronautics and Space Administration (NASA). The government has certain rights in the invention. --

Signed and Sealed this  
Twenty-sixth Day of June, 2012

David J. Kappos  
*Director of the United States Patent and Trademark Office*